United States Patent
Smith et al.

(10) Patent No.: US 9,935,033 B2
(45) Date of Patent: Apr. 3, 2018

(54) HEAT SINK COUPLING USING FLEXIBLE HEAT PIPES FOR MULTI-SURFACE COMPONENTS

(71) Applicant: Intel Corporation, Santa Clara, CA (US)

(72) Inventors: Susan F. Smith, Olympia, WA (US); Jeffory L. Smalley, East Olympia, WA (US); Mani Prakash, University Place, WA (US); Thu Huynh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/918,119

(22) Filed: Oct. 20, 2015

(65) Prior Publication Data

US 2016/0118315 A1    Apr. 28, 2016

Related U.S. Application Data

(60) Provisional application No. 62/067,859, filed on Oct. 23, 2014.

(51) Int. Cl.
*H01L 23/00* (2006.01)
*H01L 23/367* (2006.01)
(Continued)

(52) U.S. Cl.
CPC ........ *H01L 23/3672* (2013.01); *H01L 23/427* (2013.01); *H01L 25/065* (2013.01);
(Continued)

(58) Field of Classification Search
None
See application file for complete search history.

(56) References Cited

U.S. PATENT DOCUMENTS

| 5,808,236 A | 9/1998 | Brezina et al. |
| 2006/0176666 A1 | 8/2006 | Saturley et al. |

(Continued)

FOREIGN PATENT DOCUMENTS

| JP | 8255858 | 10/1996 |
| JP | 8255858 | 10/1998 |

(Continued)

OTHER PUBLICATIONS

"Spring." Merriam-Webster.com. Merriam-Webster, n.d. Web. Jul. 24, 2017.*

(Continued)

*Primary Examiner* — Reema Patel
(74) *Attorney, Agent, or Firm* — Schwabe, Williamson & Wyatt, P.C.

(57) ABSTRACT

An apparatus including a primary device and at least one secondary device coupled in a planar array to a substrate; a first heat exchanger disposed on the primary device and having an opening over an area corresponding to the at least one secondary device; a second heat exchanger disposed in the opening on the at least one secondary device; at least one heat pipe coupled to the first heat exchanger and the second heat exchanger. A method including placing a heat exchanger on a multi-chip package, the heat exchanger including a first portion, a second portion and at least one heat pipe coupled to the first portion and the second portion; and coupling the heat exchanger to the multi-chip package.

10 Claims, 10 Drawing Sheets

(51) Int. Cl.
*H01L 25/00* (2006.01)
*H01L 25/065* (2006.01)
*H01L 23/427* (2006.01)
*H01L 21/48* (2006.01)
*H01L 23/40* (2006.01)

(52) U.S. Cl.
CPC .......... *H01L 25/50* (2013.01); *H01L 21/4882* (2013.01); *H01L 23/40* (2013.01); *H01L 23/4006* (2013.01); *H01L 2023/4037* (2013.01); *H01L 2023/4056* (2013.01); *H01L 2023/4068* (2013.01); *H01L 2924/0002* (2013.01)

(56) References Cited

U.S. PATENT DOCUMENTS

| | | |
|---|---|---|
| 2008/0150125 A1 | 6/2008 | Braunisch et al. |
| 2008/0266808 A1 | 10/2008 | Aberg et al. |
| 2009/0085187 A1* | 4/2009 | Scott ............... H01L 23/42 257/690 |
| 2011/0088874 A1* | 4/2011 | Meyer, IV ........... F28D 15/046 165/104.26 |
| 2012/0162922 A1 | 6/2012 | Cheyne et al. |
| 2013/0258599 A1 | 10/2013 | Danello et al. |
| 2014/0239482 A1 | 8/2014 | Kourakata et al. |
| 2016/0284624 A1* | 9/2016 | Yamada ............. H01L 23/3675 |

FOREIGN PATENT DOCUMENTS

| | | |
|---|---|---|
| JP | 201433085 | 2/2014 |
| KR | 20140018115 | 2/2014 |
| TW | 516808 | 1/2003 |
| WO | WO-2014148026 | 9/2014 |

OTHER PUBLICATIONS

PCT Search Report and Written Opinion for International application No. PCT/US2014/057922 dated Jun. 26, 2015.

Intel Corporation, "First Office Action", JP Application No. 2015-208160, (dated Dec. 6, 2016).

Intel Corporation, "Non final office action", U.S. Appl. No. 14/767,843, (dated Sep. 26, 2016).

Intel Corporation, "Non-Final Office Action", TW Application No. 104134033, (dated Dec. 16, 2016).

Intel Corporation, "International Preliminary Report on Patentability and Written Opinion", PCT Application No. PCT/US2014/057922, (dated Mar. 28, 2017).

Intel Corporation, "Final Office Action", U.S. Appl. No. 14/767,843, (dated Feb. 14, 2017).

Intel Corporation, "Notice of Preliminary Rejection", KR Application No. 2015-0147599, (dated Feb. 13, 2017).

* cited by examiner

HEAT SINK COUPLING USING FLEXIBLE HEAT PIPES FOR MULTI-SURFACE COMPONENTS

CROSS-REFERENCE TO RELATED APPLICATION

The application is claims the benefit of the earlier filing date of U.S. Provisional Patent Application No. 62/067,859, filed Oct. 23, 2014 and incorporated herein by reference.

BACKGROUND

The present disclosure generally relates to the field of integrated circuit (IC) devices and, more particularly, to techniques and configurations for heat removal from multi-chip packages such as heat sink coupling through flexible heat pipes for multi-surface components.

DETAILED DESCRIPTION

Figure 1:
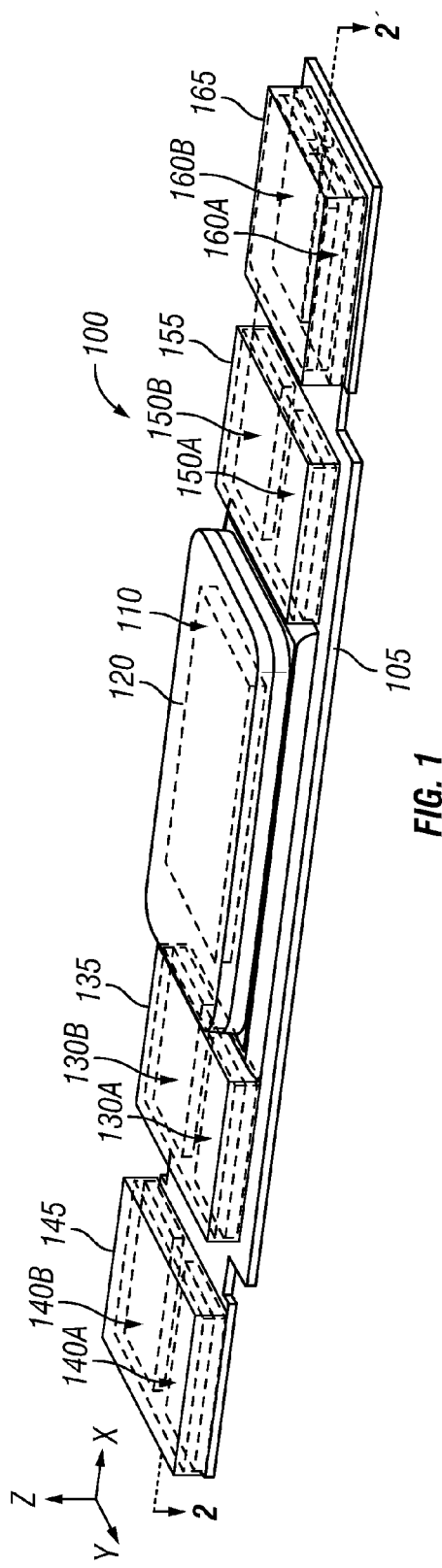
FIG. 1 shows a top side perspective view of a generic multi-chip central processing unit (CPU) package.

IC technology companies may be developing more integrated multi-chip products consisting of processor, memory, and companion chips. Packaging can consist of a single IHS (Integrated Heat Spreader) over all the components or individual IHSs for each component. FIG. 1 shows a top side perspective view of a generic multi-chip central processing unit (CPU) package. Package 100 includes die 110 disposed on processor substrate 105. Overlying die 110 is IHS 120 with a thermal interface material (TIM1) therebetween. In one embodiment, package 100 also includes secondary devices of, for example, memory chip 130A, memory chip 130B, memory chip 140A, memory chip 140B, memory chip 150A and memory chip 150B, as well as companion chip 160A and companion chip 160B that are, for example, each a processor. It is appreciated that the secondary devices as memory chips and companion chips are one example. In another embodiment, other types of devices can be present in the package. Each of the primary device (die 110) and the secondary devices (memory chips 130A/B, 140A/B, 150A/B, and companion chips 160A/B) are connected in a planar array to substrate 105. In one embodiment, a thickness (z-dimension) of one or more of the secondary devices is different than a thickness (z-dimension) of die 110. In one embodiment, one or more of the secondary devices has a z-dimension thickness that is less than a thickness of die 110. In another embodiment, a z-direction thickness of one or more secondary devices is different from die 110 and one or more other secondary devices.

In one embodiment, overlying each secondary device is an IHS with a TIM1 therebetween. In this embodiment, one IHS overlies two secondary devices. FIG. 1 shows IHS 135 on memory chip 130A and memory chip 130B; IHS 145 on memory chip 140A and on memory chip 140B; IHS 155 on memory chip 150A and on memory chip 150B. FIG. 1 also shows IHS 165 on companion chip 160A and companion chip 160B. Between each of the memory chips and companion chips and their corresponding IHS is a TIM1. In one embodiment, TIM1 is consistently thin or effectively minimal between each IHS and its respective primary device (e.g., die 110) or secondary device (e.g., memory chip 130A-150A, companion chip 160A-B) to improve the thermal performance between each heat generating component and a cooling solution and thus minimize the temperature of each component. In one embodiment, a suitable TIM1 is a polymer TIM with a standard thickness.

FIG. 1 is an example of components with IHSs or packages for each device. Each component is at various heights but all require adequate cooling.

Figure 2:
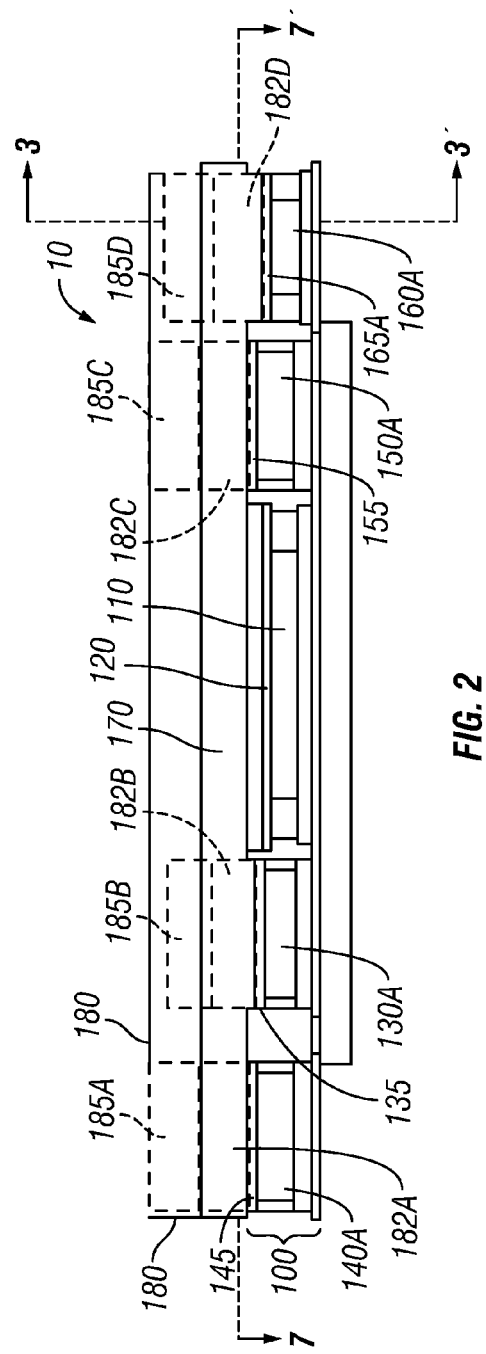
FIG. 2 shows a cross-sectional side view of an assembly including the multi-chip package of FIG. 1 through line 2-2' of FIG. 1 having a cooling solution thereon.

In some solutions, the emphasis is on the thermal improvements which can be achieved from the component's junction to the cooling solution base such as the base of an air-cooled heat sink. FIG. 2 shows a side view of an assembly including the multi-chip package of FIG. 1 thereon. Referring to FIG. 2, assembly 101 includes a cooling solution that, in this embodiment, is a passive heat exchanger that is a heat sink including a first portion including heat sink base 170 and fins 180. The first portion of the heat sink includes an area dimension that, in one embodiment, is disposed over an area portion of multi-chip package 100 or an area of multi-chip package 100 including heat generating devices (e.g., an area including the primary device and secondary devices). FIG. 2 shows a first portion of the heat exchanger (heat sink) over or on CPU die 110 and IHS 120 with heat sink base 170 justified to IHS 120. Heat sink base 170 is justified to IHS 120 in the sense that it is in physical contact with the IHS or in contact with a TIM2 material disposed on a surface of IHS 120 to a minimum effective thickness for such material.

FIG. 2 shows a first portion of the heat exchanger (heat sink) including heat sink base 170 and fins 180 also includes a number of openings over areas corresponding to the secondary devices of multi-chip package 100, notably memory dies 130A, 130B, 140A, 140B, 150A and 150B and companion dies 160A and 160B. Disposed within such openings are second heat exchanger (heat sink) portions each including a base and fin structure. FIG. 2 shows second heat sink fin 185A on base 182A disposed over or on memory die 140A and memory die 140B; fin 185B on base 182B disposed over memory die 130A and memory die 130B; heat sink fin 185C on base 182C disposed over memory die 150A and memory die 150B; and heat sink fin 185D disposed over companion die 160A and companion die 160B).

Figure 3:
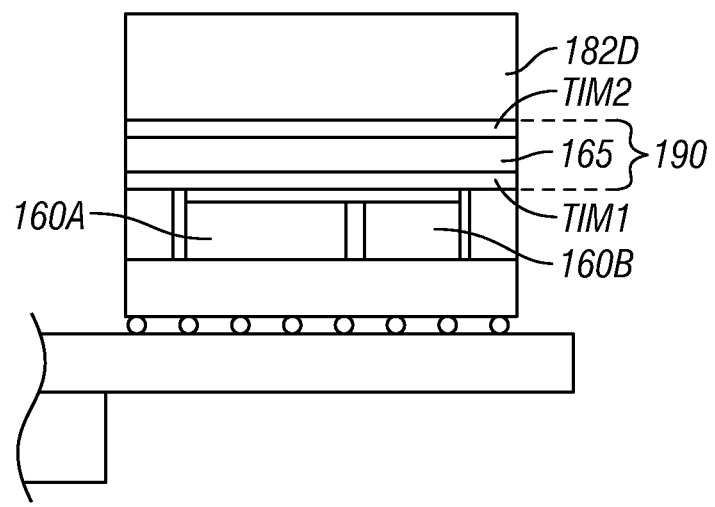
FIG. 3 shows a cross-section through line 3-3' of FIG. 2.

The introduction of a cooling solution on multi-chip package may include coupling of self-adjusting heat sink surfaces to multi-surface height components which may minimize both TIM1 (between the die and IHS) and TIM2 (between the IHS and cooling solution base) and may result in significant increased thermal performance and opportunities. FIG. 3 shows a cross-section through line 3-3' of FIG. 2. FIG. 3 illustrates TIM1 between each of die 160A and die 160B and IHS 165 and TIM2 between IHS 165 and heat sink base 182D. FIG. 3 shows junction 190 to heat sink base 182D defined by a thickness of TIM1 and TIM2 and a thickness of IHS 165.

Figure 4:
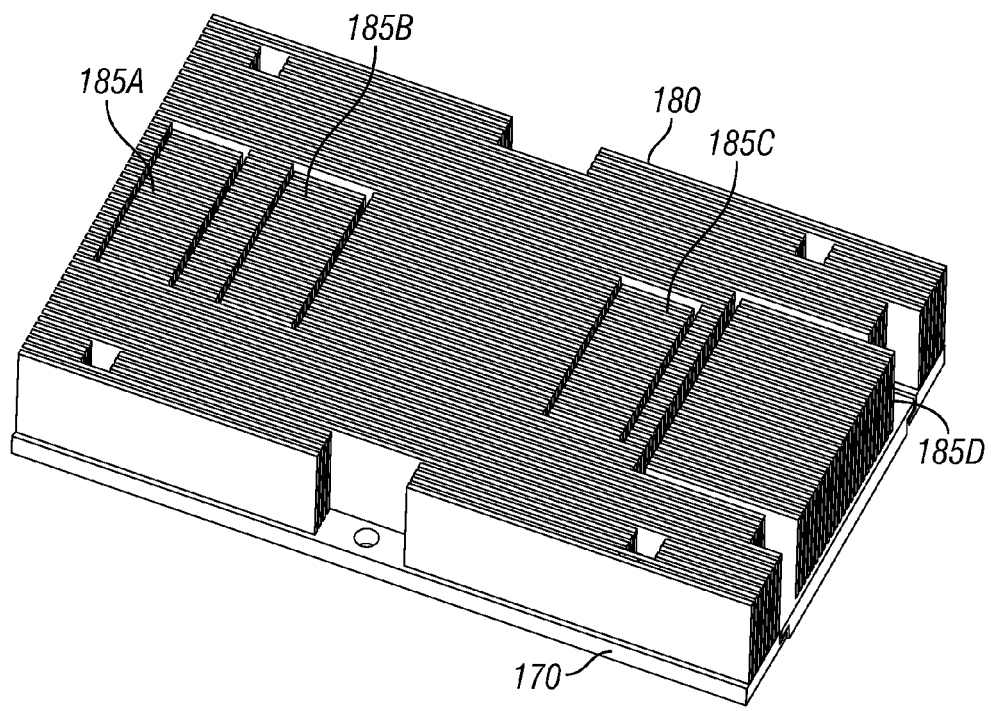
FIG. 4 shows a top side perspective view of the heat sink of FIG. 2.
Figure 5:
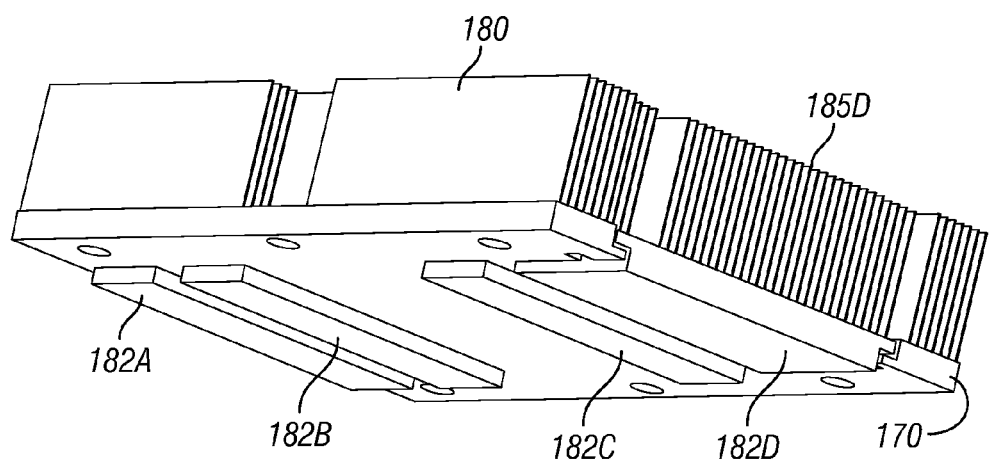
FIG. 5 shows a bottom perspective view of the heat sink of FIG. 2.

FIG. 4 shows a top side perspective view of the heat sink of FIG. 2. FIG. 2 shows the first portion of the heat sink including heat sink fin 180 and second heat exchanger portions including heat sink fins 185A, 185B, 185C and 185D. FIG. 5 shows a bottom perspective view of the heat sink of FIG. 2. FIG. 4 shows the heat sink including heat sink base 170 and secondary heat sink bases 182A-182D within cavities of heat sink base 170.

Figure 6:
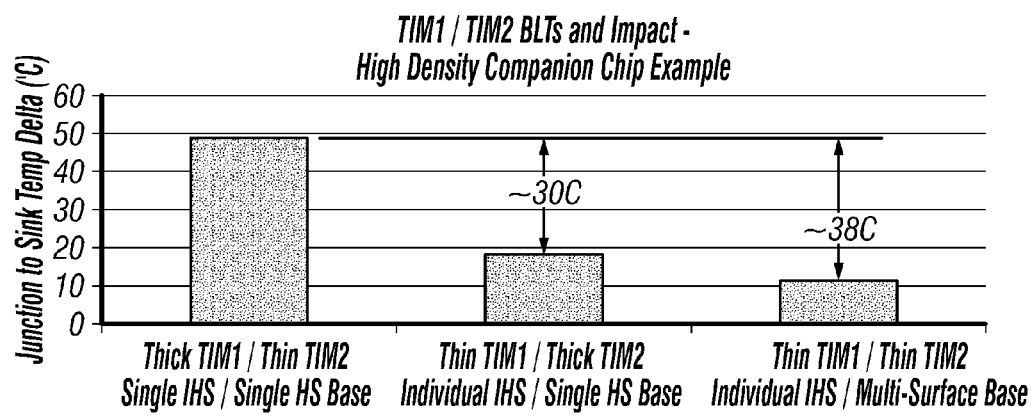
FIG. 6 shows a graphical comparison of an assembly including a multi-chip package and a single IHS and heat sink for all devices (primary device and second device(s)) and an assembly with a separate IHS and heat sink for a primary device and each secondary device or as in FIGS. 2-4 for each pair of secondary devices.
Figure 7:
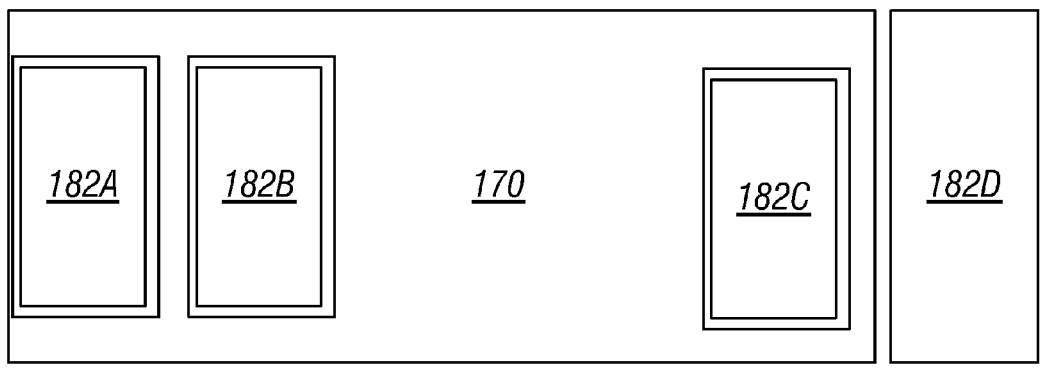
FIG. 7 shows a cross-section of the assembly of FIG. 2 through line 7-7' and shows the second heat sink base portions in openings in the first heat sink base.

FIG. 6 shows a graphical comparison of an assembly including a multi-chip package and a single IHS and heat sink for all devices (primary device and second device(s)) and an assembly with a separate IHS and heat sink for a primary device and each secondary device or as in FIGS. 2-4 for each pair of secondary devices. FIG. 6 also illustrates the effect of the different thicknesses of TIM1 and TIM2. FIG. 6 illustrates that separate IHS and heat sinks improves the thermal performance of the cooling solution. The improvement was achieved through individual heat sinks with no thermal conduction between them even though each was integrated into one heat sink module. The methodology significantly improves thermals but essentially conductively isolates each heat sink from each other as shown in FIG. 7. FIG. 7 shows a cross-section of the assembly of FIG. 2 through line 7-7' and shows the second heat sink base portions 182A-182D in openings in first heat sink base 170. FIG. 7 illustrates that the openings isolate the first and second base portions from one another. This type of heat sink arrangement can be optimized for either CPU centric or companion die centric workloads but may result in suboptimal performance for dynamic workloads where the majority of the power demand shifts between CPU and companion dies.

Some embodiments of the disclosure focus on further maximizing the cooling solution performance by coupling the cooling resources together and creating effective thermal connections between the multiple heat sinks while still controlling thin TIM1 and TIM2 bond line thickness for each component. This allows for even higher cooling capability for each component versus individual, isolated heat sinks. Since workloads are predicted to become highly dynamic depending on the application, significant opportunities exist to provide cooling solutions that can adapt to the changing power conditions. For example, if the workload is CPU centric then the CPU can utilize all the coupled heat sinks to increase its power cooling capability while the other components are operating at lower power loads. When the workload changes so that the workload becomes companion die centric the companion die heat can be dissipated through all the connected heat sinks while the CPU is operating at lower power.

A basic principle is to further expand the cooling capability and performance of EACH component on a multi-chip package or even multiple packages on a motherboard. This solution combines or couples the cooling solutions of multiple components allowing each component to increase its individual component power cooling capability to greater than its individual cooling capability. The advantage could also be taken as lowering temperatures if power levels are not increased. In addition, the solution minimizes the TIM1 and TIM2 bondline thickness (BLT), which also greatly expands each component's power capability as shown in the previous work.

A heat load coupling with self-adjusting surfaces for multi-surface components is described. A primary feature is the heat transfer coupling or combining of the cooling solutions of multiple components to either increase the overall power capability of each component and/or reduce the component operating temperatures. A self-adjusting solution to multiple height surfaces increases power capability and/or reduces temperatures and allows continued use of existing TIM2s. The adjustable load per component translates to a more robust solution Alternative solutions to this problem may maintain one large heat sink which means some components take a significant thermal hit due to very thick thermal interface material bond line thickness. Some solutions may implement a combination of TIM2 types and bond line thicknesses between the top surface of the components and a single heat sink in the cooling solution. The combination of different TIMs may provide a high performance phase change or grease material on the primary chip (CPU) with minimal bond line thickness (~5 mils) and a low performance gap filler or pad TIM on the other components which require a very thick bond line thickness (~16 mils). This may no longer be practical as multiple components may now be critical to cool efficiently in order to maximize performance.

Some multi-chip packages w/companion chip may be able to absorb a thick TIM1 bond line thickness and corresponding thermal penalty with the single IHS solution but may have a larger chip and lower power density than what is planned in other multi-chip packages. The chip average power density of the other multi-chip packages may be 2× due to a focused design effort to compress the die area coupled with speed increase and process shrink.

Referring to the multi-chip CPU package of FIG. 1, this package has both memory and other companion die on the processor substrate. Each of the discrete devices or components may need cooling with varying z-heights relative to a solid base heat sink surface. In order to minimize both the TIM1 and TIM2 bond lines a heat sink with multiple heat transfer surfaces contained in the primary heat sink base may be utilized. This heat sink may include internal springs that allow each of heat sink surfaces to be independently loaded in order to control the TIM2 bond line between each component. In addition to the internal springs a flexible heat pipe is embedded in each or selected ones of the heat transfer surfaces.

Figure 8:
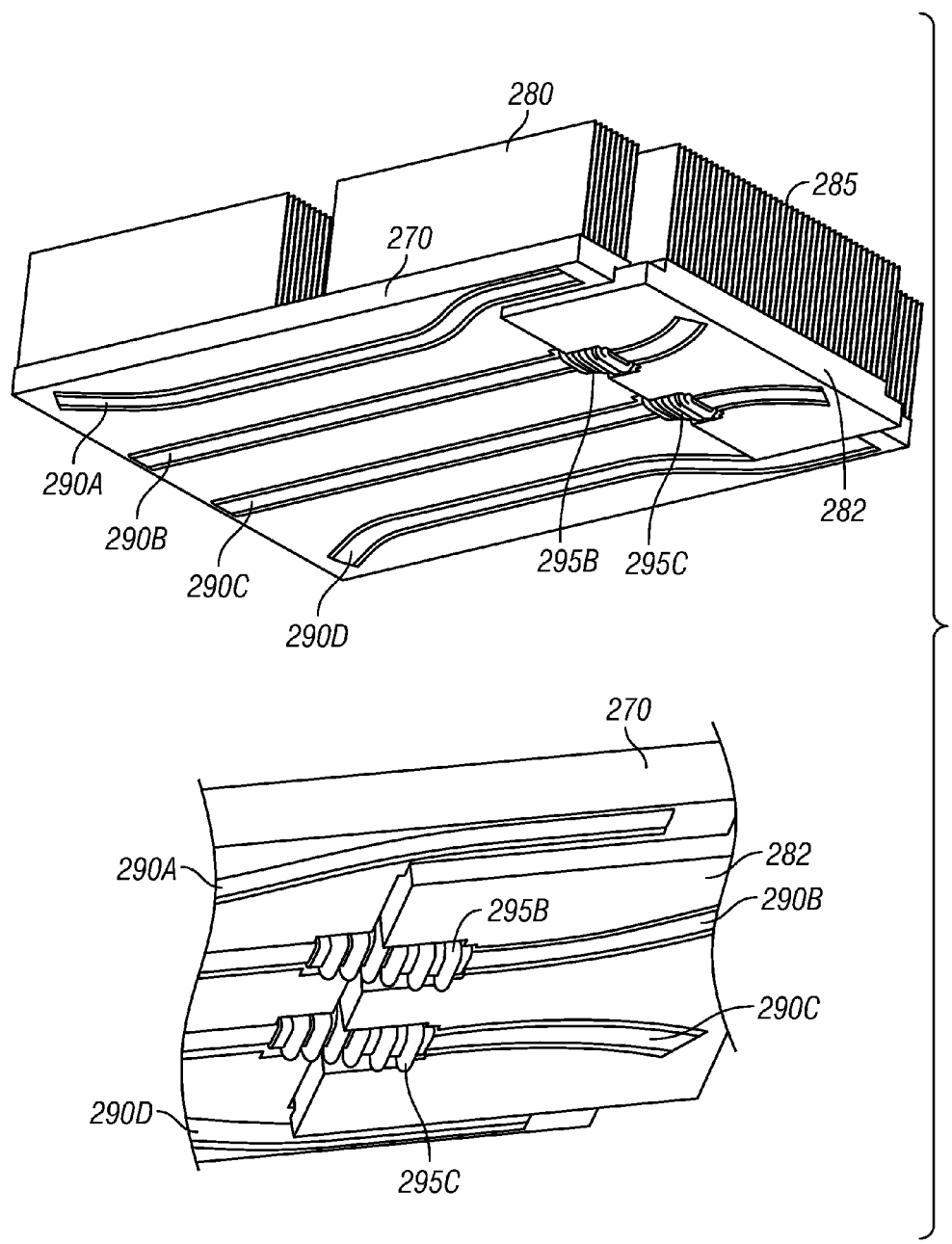
FIG. 8 shows another embodiment of a heat sink including a heat sink base and fin portion with flexible heat pipes connected to the heat sink base.

FIG. 8 shows a bottom side perspective view of a heat sink including a heat sink base and fin portion with flexible heat pipes connected to the heat sink base. FIG. 8 shows an implementation of flexible heat pipes implemented on a heat sink thus thermally connecting/coupling the two independent heat transfer surfaces.

In one embodiment, the heat sink shown in FIG. 7 is similar to that described with reference to FIGS. 2, 4 and 5 including a first portion including an area dimension that approximate an area dimension of the multi-chip package and includes heat sink base 270 and fins 280. The first portion includes one or more openings over area(s) corresponding to secondary device area(s) of a multichip package. Disposed within the one or more of the first portion of the heat sink are second heat sink portion(s) each including a base and fin structure. The heat sink also includes one or more heat pipes connected to the first portion heat sink base and the one or more second heat sink bases. In one embodiment, the one or more heat pipes are embedded in the heat sink bases (e.g., in grooves or channels in the heat sink base(s)). In one embodiment, a heat pipe has a flexible section that extends across at least a portion of a junction between two or more heat sink bases. The focus is to couple or combine multiple cooling solutions with a heat pipe that has the flexibility to allow each contacting surface to be at differing heights, minimizing both the TIM1 and TIM2 bond line thicknesses. The flexible section in the heat pipe allows the second heat transfer surface to be referenced to a different surface with respect to the first heat transfer surface. The flexible section in the heat pipe allows the transfer of heat between the cooling solutions, increasing the cooling capability of each component and/or lowering the component temperatures as the workload varies.

FIG. 8 shows a heat sink for a multi-chip package, the heat sink including a first portion including heat sink base 270 and fins 280. In this embodiment, the first portion of the heat sink includes one opening to accommodate a second heat sink portion therein. FIG. 8 shows the second heat sink portion includes heat sink base 282 and fins 285. The second heat sink portion is aligned over an area of a multi-chip package that includes one or more secondary devices such as one or more memory die or companion die. On an underside heat sink base 270 and heat sink base 282 are heat pipe 290A, heat pipe 290B, heat pipe 290C and heat pipe 290D. In one embodiment, each heat pipe is embedded in or disposed in a channel cut or otherwise formed into the underside of the respective bases. FIG. 8 shows heat pipe 290A and heat pipe 290D connected to and disposed in a channel in heat sink base 270 and heat pipe 290B and heat pipe 290C connected to and disposed in a channel in each of heat sink base 270 and heat sink base 282. Heat pipe 290B includes flexible portion 295B that is disposed across a junction between heat sink base 270 and heat sink base 282. Similarly, heat pipe 290C includes flexible portion 295C that is disposed across a junction between each heat sink base. Flexible portions 295B and 295C are illustrated, in this embodiment, with an accordion shaped, flexible section to allow for expansion or contraction along the length of the heat pipe as each cooling solution base is mated to its corresponding surface.

In one embodiment, each of heat pipes 290A-290D contains a fluid. A material for each of heat pipes 290A-290D is selected for a working temperature range of interest and fluid compatibility. Examples of material include copper with water as the fluid and aluminum with ammonia as the fluid. Other materials may be selected for other fluids (e.g., helium, mercury sodium). Each of heat pipes 290A-290D, in one embodiment, also contains a wicking material therein. A representative diameter range for heat pipes 290A-290D is 0.5 millimeters (mm) to 20 mm. A representative example diameter is on the order of 6 mm. A cross-sectional shape of a heat pipe may be circular, oval, rectangular, or other shape.

Figure 9:
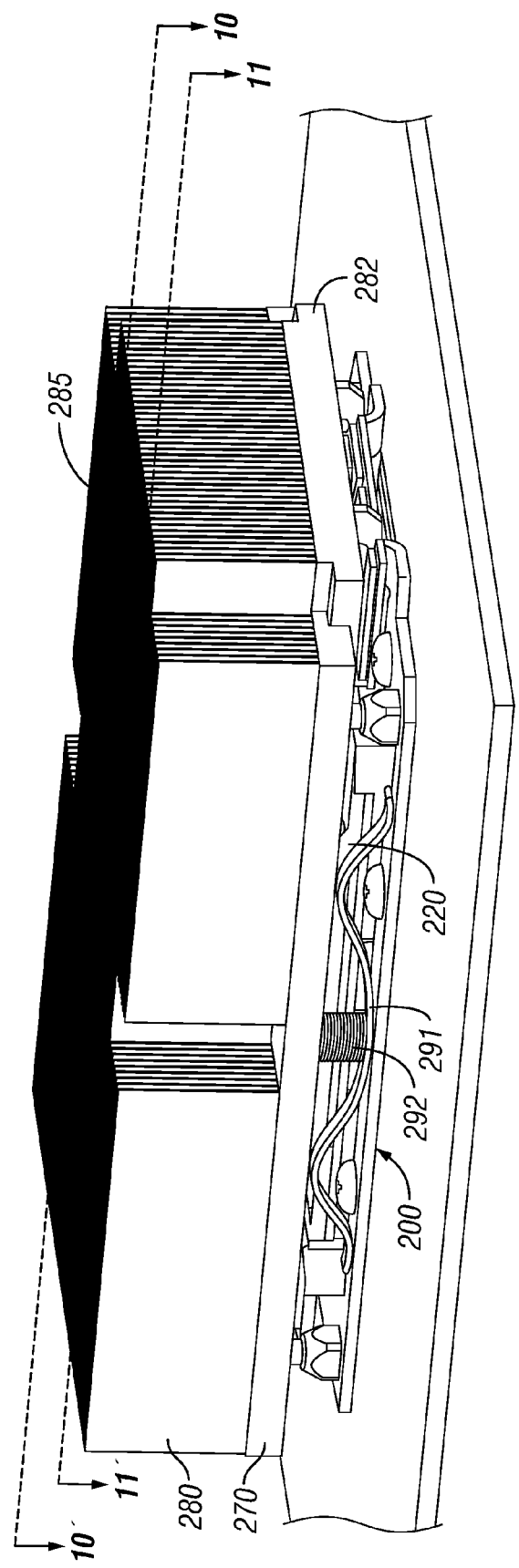
FIG. 9 shows an embodiment of a heat sink of FIG. 8 as it would be connected to a multi-chip processor.
Figure 10:
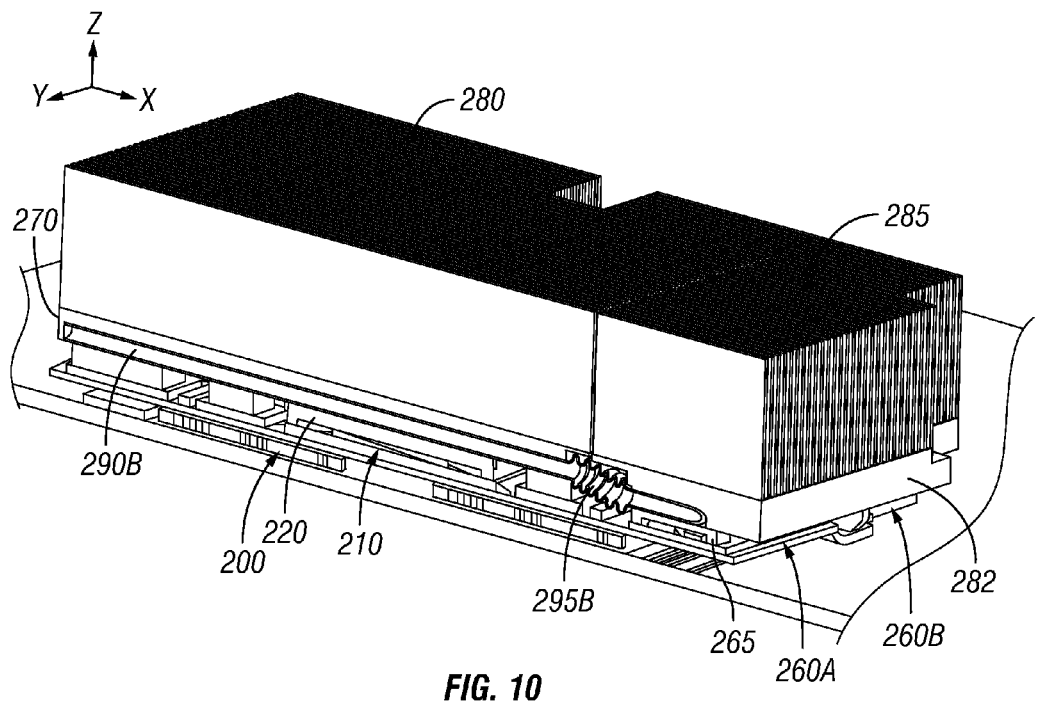
FIG. 10 shows a cross section through line 10-10' of FIG. 9.

FIG. 9 shows an embodiment of a heat sink as it would be connected to a multi-chip processor. Multi-chip processor 200 includes microprocessor or central processing unit (CPU) 210 having IHS 220 thereon. In this embodiment, processor 200 includes one or more secondary devices (e.g., companion chip 260A and companion chip 260B) with IHS 265 thereon. FIG. 10 shows a cross section through line 10-10' of FIG. 9. FIG. 10 shows heat pipe 290B embedded in heat sink base 270 and heat sink base 282 with flexible portion 295B disposed across a junction between the bases. The primary heat transfer surface defined by an underside of heat sink base 270 is referenced to IHS 220 while the heat transfer surface defined by an underside of heat sink base 282 is referenced to a companion chip IHS 265. FIG. 9 also shows an example of a primary connection of the heat sink to package 200 through mechanical load spring 291 that is deflected (e.g., compressed) by screw 292 that is accessible at a superior surface of heat sink base 270 (as viewed).

Figure 11:
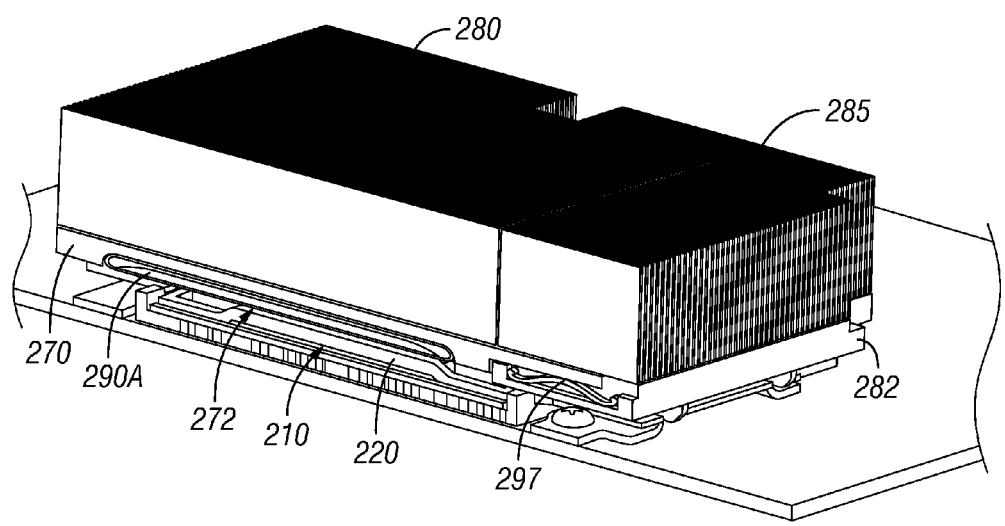
FIG. 11 is a cross-section through line 11-11' of FIG. 9.

Each surface in this configuration may have an independent set of heat sink fins that are conductively isolated from the other fins (fins 280 of first portion of the heat sink and fins 285 of the second portion). In this design the first cooling solution portion may be attached to mechanical loading solution springs that provide the force necessary to activate the socket. The load may be transferred through heat sink base 270 into the CPU IHS 220. A second cooling solution portion generates independent loading of each of the companion chips through compression of wave or coil springs as the second heat sink base makes contact with the IHS(s) of companion chip(s) (e.g., IHS 265). These wave or coil springs are located internal to the multi-surface heat sink. FIG. 11 shows a cross section of the multi-surface heat sink depicting the relative location of the internal loading spring 297. Spring 297 may generate enough force to displace the flexible section of the heat pipe in addition to providing the correct load to the companion chips. FIG. 11 shows wave spring 297 in contact at each end with second heat sink base 282 and a mid portion in contact with heat sink base 270. Initially, a heat exchanger including first heat sink (heat sink base 270 and fins 280) and second heat sink (heat sink base 282 and fins 285) is placed on a multi-chip package (package 200). Prior to deflection of a spring 297, in one embodiment, second heat sink base 297 extends beyond a plane of a surface of heat sink base 270 (extends a distance beyond surface 272 of heat sink base 270 that is justified to the CPU (IHS 220 on CPU 210). As the passive heat exchanger (heat sink) is assembled on multi-chip package 200, heat sink base 270 is justified to IHS 220 and spring 297 is deflected and second heat sink base 282 may be displaced in a direction away from multi-chip package 200 (i.e., a direction toward surface 272 of heat sink base 270). Deflection of mechanical loading spring 291 (see FIG. 9), in one embodiment, is used to connect the heat exchanger to multi-chip package (e.g., deflecting of a primary spring with a screw connection between the heat exchanger and the package). Deflection of a mechanical loading spring aids in a deflection of spring 297. In one embodiment, a predetermined amount of force (e.g., 200 pound force (890 newtons) to 250 pound force (1112 newtons) is transferred through heat sink base 270 into IHS 220.

Figure 12:
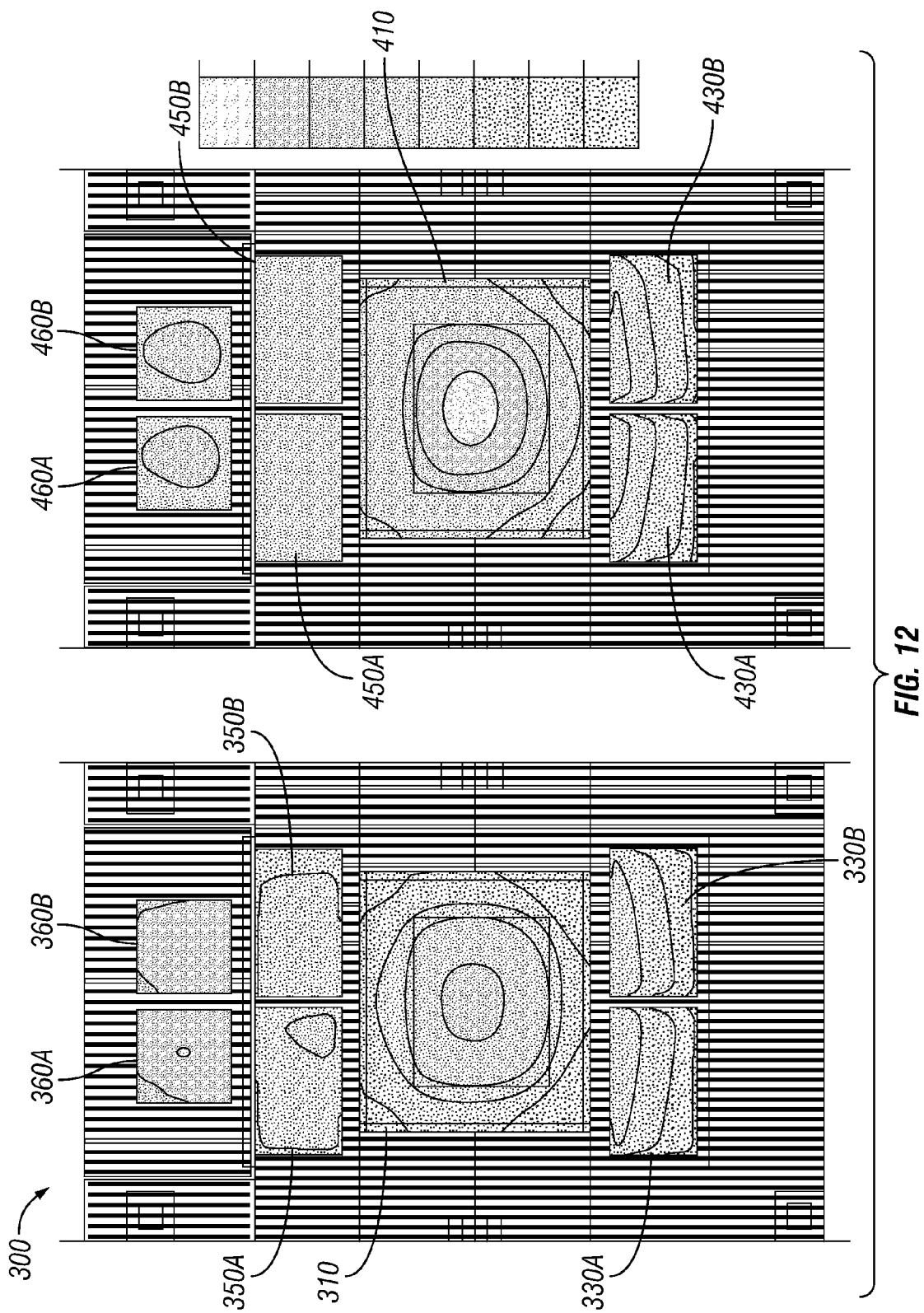
FIG. 12 shows a representative temperature profile of a representative multi-chip package with and without heat sink coupling utilizing heat pipes.
Figure 13:
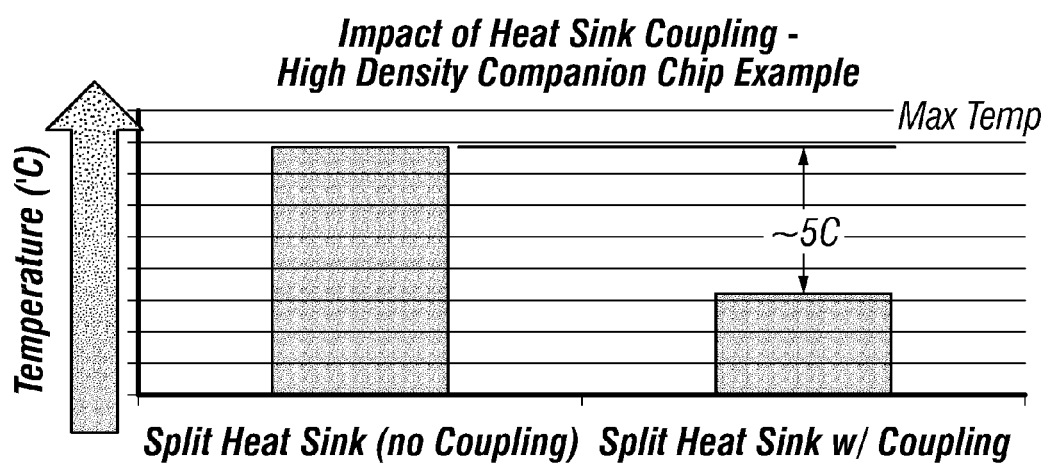
FIG. 13 shows a temperature impact of coupling versus not coupling the heat sinks in the example of FIG. 12.

The thermal impact is a significant thermal improvement as shown in FIGS. 12-13 below. FIG. 12 shows a representative temperature profile of a representative multi-chip package with and without heat sink coupling utilizing heat pipes. Multi-chip package 300 including processor 310 utilizing a first heat sink and memory dice 330A, 330B, 350A and 350B and companion dice 360A and 360B utilizing separate heat sinks that are not connected to the first heat sink through, for example, heat pipes. Multi-chip 400 includes processor 410 utilizing a first heat sink and memory dice 430A, 430B, 450A and 450B and companion dice 460A and 460B utilizing heat sink portions that are connected to the first heat sink portion through heat pipes. FIG. 13 shows a temperature impact of coupling versus not coupling the heat sinks in the example of FIG. 12. The temperature of high density companion chips decreases by 5° C. in this example, which may not be optimized yet. Further improvements can be obtained with the optimization of the heat pipe layouts.

In the above description, reference is made to a heat exchanger including base and fin portions generally associated with air cooling. In another embodiment, the heat exchanger can have a liquid cooling base with internal fins.

Some of the advantages of heat sink coupling thru flexible heat pipes for multi-surface components include.

Heat transfer coupling of heat sink solutions in combination with self-adjustment to each component's surface, thus reducing the temperature of the components and/or increasing the cooling power capability.

One heat sink assembly is utilized, maintaining simplicity for customers.

Allows continued use of existing TIM2s.

Adjustable load per component translates to a more robust solution Embodiments of the present disclosure may improve power cooling capability by coupling cooling solution resources together and utilizing these resources under various component centric workloads. Embodiments may also increase cooling efficiency at a competitive cost, resulting in lower temperatures for all components and meeting cooling requirements of each. Embodiments may increase power capability and lower temperatures, which may translate to higher frequency opportunities and improved bin split. In some cases, embodiments allow for the creation of a competitive product based on efficient thermal packaging and cooling solutions. Embodiments can also extend air cooling capability.

Figure 14:
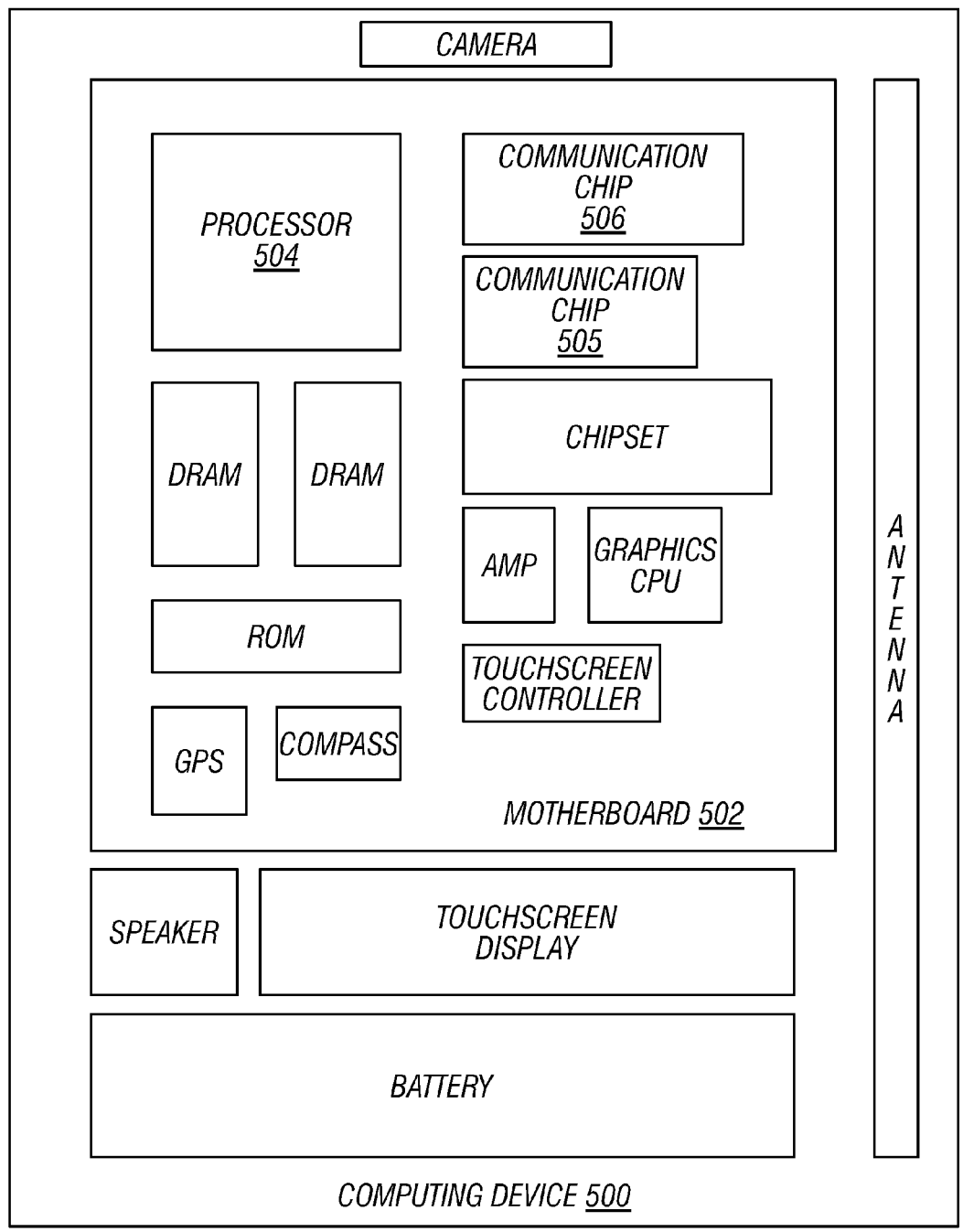
FIG. 14 illustrates an embodiment of a computing device.

Embodiments of the present disclosure may be implemented into a system using any suitable hardware and/or software to configure as desired. FIG. 14 schematically illustrates a computing device that includes an IC package assembly (e.g., multi-chip package) coupled with a heat removal assembly as described herein, in accordance with some embodiments. Computing device 500 may house a board such as motherboard 502 (e.g., in housing 508). Motherboard 502 may include a number of components, including but not limited to processor 504 and at least one communication chip 506. Processor 504 may be physically and electrically coupled to motherboard 502. In some implementations, the at least one communication chip 506 may also be physically and electrically coupled to motherboard 502. In further implementations, communication chip 506 may be part of processor 504.

Depending on its applications, computing device 500 may include other components that may or may not be physically and electrically coupled to motherboard 502. These other components may include, but are not limited to, volatile memory (e.g., dynamic random access memory (DRAM)), non-volatile memory (e.g., read only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

Communication chip 506 may enable wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. Communication chip 506 may operate in accordance with other wireless protocols in other embodiments.

Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, EV-DO, and others.

Processor 504 of computing device 500 may be packaged in an IC package assembly (e.g., multi-chip package) coupled with a heat removal assembly as described herein. For example, a circuit board may be motherboard 502 and processor 504 may be a die of a die package that is coupled with a heat removal assembly as described herein and mounted on the circuit board. Other suitable configurations may be implemented in accordance with embodiments described herein. The term "processor" may refer to any device or portion of a device that processes electronic data from registers and/or memory to transform that electronic data into other electronic data that may be stored in registers and/or memory.

Communication chip 506 may also include a die that may be packaged in an IC package assembly (e.g., multi-chip package) coupled with a heat removal assembly as described herein. In further implementations, another component (e.g., memory device or other integrated circuit device) housed within computing device 500 may include a die that may be packaged in an IC package assembly (e.g., multi-chip package) coupled with a heat removal assembly as described herein.

In various implementations, computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. Computing device 500 may be a mobile computing device in some embodiments. In further implementations, computing device 500 may be any other electronic device that processes data.

Examples

According to various embodiments, the disclosure describes an apparatus. An example of an apparatus may include a heat removal assembly having two or more surfaces configured to thermally couple with respective surfaces of two or more dies, wherein at least one of the two or more surfaces is coupled with a flexible portion of a heat pipe.

According to various embodiments, the disclosure describes a system (e.g., a computing device). An example of a system may include a circuit board, a plurality of dies mounted on the circuit board, and an assembly having two or more surfaces configured to thermally couple with respective surfaces of two or more dies, wherein at least one of the two or more surfaces is coupled with a flexible portion of a heat pipe.

Example 1 is an apparatus including a primary device and at least one secondary device coupled in a planar array to a substrate; a first heat exchanger disposed on the primary device and having an opening over an area corresponding to the at least one secondary device; a second heat exchanger disposed in the opening on the at least one secondary device; at least one heat pipe coupled to the first heat exchanger and the second heat exchanger.

In Example 2, each of the first heat exchanger and the at least one second heat exchanger of the apparatus of Example 1 includes a heat sink base and a fin structure.

In Example 3, the at least one heat pipe of the apparatus of Example 2 is coupled to the heat sink base of each of the first heat exchanger and the at least one second heat exchanger so that the heat sink base is disposed between the at least one heat pipe and the fin structure of each of the first heat exchanger and the at least one second heat exchanger.

In Example 4, the at least one heat pipe of the apparatus of Example 2 is embedded in the heat sink base of each of the first heat exchanger and the base of the at least one second heat exchanger.

In Example 5, the at least one heat pipe of the apparatus of Example 1 includes a flexible portion.

In Example 6, the flexible portion of the at least one heat pipe of the apparatus of Example 5 is disposed across a junction between the first heat exchanger and the second heat exchanger.

In Example 7, a thickness dimension of the primary device on the substrate of the apparatus of Example 3 is different than a thickness dimension of the at least one secondary device and a base of the first heat exchanger is disposed in a plane that is different from a plane in which the at least one second heat exchanger is disposed.

Example 8 is an apparatus including a heat exchanger having dimensions operable for disposition on a multi-chip package, the heat exchanger including a first portion having a first area with an opening therein; a second portion having a dimension operable for disposal in the opening; and at least one heat pipe coupled to the first heat exchanger and the second heat exchanger.

In Example 9, each of the first portion and the second portion of the heat exchanger of the apparatus of Example 8 includes a heat sink base and a fin structure.

In Example 10, the at least one heat pipe of the apparatus of Example 8 is coupled to the first heat sink base and the at least one second heat sink base.

In Example 11, the at least one heat pipe of the apparatus of Example 10 is embedded in the heat sink base of each of the first heat exchanger and the base of the at least one second heat exchanger.

In Example 12, the at least one heat pipe of the apparatus of Example 11 includes a flexible portion.

In Example 13, the flexible portion of the at least one heat pipe of the apparatus of Example 11 is disposed across a junction between the first heat exchanger and the second heat exchanger.

Example 14 is a method including placing a heat exchanger on a multi-chip package, the heat exchanger including a first portion having a first area disposed on a primary device, the first portion adjacent to at least one secondary device; a second portion disposed on the at least one secondary device; and at least one heat pipe coupled to the first portion and the second portion; and coupling the heat exchanger to the multi-chip package.

In Example 15, each of the first portion and the second portion of the heat exchanger in the method of Example 14 includes a heat sink base and a fin structure and a spring is disposed between the first sink base and the at least one second heat sink base.

In Example 16, the at least one heat pipe in the method of Example 14 is coupled to the first heat sink base and the at least one second heat sink base.

In Example 17, the at least one heat pipe in the method of Example 16 is embedded in the heat sink base of each of the first heat exchanger and the base of the at least one second heat exchanger.

In Example 18, the at least one heat pipe in the method of Example 14 includes a flexible portion.

In Example 19, the flexible portion of the at least one heat pipe in the method of Example 18 is disposed across a junction between the first heat exchanger and the second heat exchanger.

In Example 20, the first portion of the heat exchanger of any of the methods of Examples 14-19 includes an opening over an area corresponding to the at least one secondary device and the second portion is disposed in the opening.

In Example 21, a multi-chip package assembly made by any of the methods of Examples 14-20.

Various embodiments may include any suitable combination of the above-described embodiments including alternative (or) embodiments of embodiments that are described in conjunctive form (and) above (e.g., the "and" may be "and/or"). Some embodiments may include one or more methods of removing heat from a multi-chip package and/or actions related to providing and/or fabricating a heat removal assembly as described herein. Furthermore, some embodiments may include one or more articles of manufacture (e.g., non-transitory computer-readable media) having instructions, stored thereon, that when executed result in actions of any of the above-described embodiments. More-over, some embodiments may include apparatuses or systems having any suitable means for carrying out the various operations of the above-described embodiments.

The foregoing description of one or more implementations provides illustration and description, but is not intended to be exhaustive or to limit the scope of the invention to the precise form disclosed. Modifications and variations are possible in light of the above teachings or may be acquired from practice of various implementations of the invention.

The invention claimed is:

1. An apparatus comprising:
   a primary device and at least one secondary device coupled in a planar array to a substrate;
   a first heat exchanger disposed on the primary device and having an opening over an area corresponding to the at least one secondary device, wherein the first heat exchanger is coupled to the substrate by a first spring;
   a second heat exchanger disposed in the opening on the at least one secondary device;
   at least one heat pipe coupled to the first heat exchanger and the second heat exchanger, the at least one heat pipe embedded in or disposed in a channel disposed in a bottom of a heat sink base of each of the first heat exchanger and the second heat exchanger; and
   a second spring coupled to the second heat exchanger and the first heat exchanger.

2. The apparatus of claim 1, wherein each of the first heat exchanger and the second heat exchanger further comprises a fin structure.

3. The apparatus of claim 2, wherein that the heat sink base is disposed between the at least one heat pipe and the fin structure of each of the first heat exchanger and the at least one second heat exchanger.

4. The apparatus of claim 1, wherein the at least one heat pipe comprises a flexible portion.

5. The apparatus of claim 4, wherein the flexible portion of the at least one heat pipe is disposed across a junction between the first heat exchanger and the second heat exchanger.

6. The apparatus of claim 3, wherein a thickness dimension of the primary device on the substrate is different than a thickness dimension of the at least one secondary device and a base of the first heat exchanger is disposed in a plane that is different from a plane in which the at least one second heat exchanger is disposed.

7. An apparatus comprising:
   a heat exchanger having dimensions operable for disposition on a multi-chip package, the heat exchanger comprising:
   a first portion having a first area with an opening therein, wherein the first portion is coupled to the multi-chip package with a first spring;
   a second portion having dimension operable for disposal in the opening;
   at least one heat pipe coupled to the first portion and the second portion of the heat exchanger, the at least one heat pipe embedded in or disposed in a channel disposed in a bottom of a heat sink base of each of the first portion and the second portion of the heat exchanger; and
   a second spring coupled to the first portion and the second portion of the heat exchanger.

8. The apparatus of claim 7, wherein each of the first portion and the second portion of the heat exchanger further comprises a a fin structure.

9. The apparatus of claim 7, wherein the at least one heat pipe comprises a flexible portion.

10. The apparatus of claim 9, wherein the flexible portion of the at least one heat pipe is disposed across a junction between the first portion and the second portion of the heat exchanger.

* * * * *